United States Patent [19]

Hasler

[11] Patent Number: 5,004,989
[45] Date of Patent: Apr. 2, 1991

[54] OSCILLATOR FOR CONTROLLING A MIXER STAGE IN A TUNER

[75] Inventor: Rudolf Hasler, Vienna, Austria

[73] Assignee: U.S. Philips Corp., New York, N.Y.

[21] Appl. No.: 450,338

[22] Filed: Dec. 13, 1989

[30] Foreign Application Priority Data

Dec. 19, 1988 [AT] Austria ................... 3081/88

[51] Int. Cl.$^5$ ............................................. H03B 5/00
[52] U.S. Cl. .................................................. 331/117 R
[58] Field of Search ........ 331/108 R, 117 R, 117 FE, 331/167

[56] References Cited

U.S. PATENT DOCUMENTS 4,034,298 7/1977 McFadyen et al. ................ 331/8 X

Primary Examiner—Robert J. Pascal
Attorney, Agent, or Firm—Emmanuel J. Lobato

[57] ABSTRACT

In an oscillator (1) comprising a parallel resonant circuit (4), which for fine-tuning the oscillator includes a variable capacitance which is variable in dependence upon a fine-tuning control signal and is constituted by the capacitance occurring in the collector circuit of a transistor. This transistor is a separate transistor (12) whose collector is capacitively coupled to the parallel resonant circuit and which is arranged in common base configuration for alternating current, while its operating point is chosen to be in its saturation range, the fine-tuning control signal being applied to the base-emitter path of this transistor and the transistor base-collector junction, which is in its pass region, being driven further into conduction by this signal within its control range on the one hand, and being driven from its pass region into its cut-off region on the other hand.

2 Claims, 1 Drawing Sheet

OSCILLATOR FOR CONTROLLING A MIXER STAGE IN A TUNER

BACKGROUND OF THE INVENTION

The invention relates to an oscillator for controlling a mixer stage in a tuner, which oscillator comprises a parallel resonant circuit including a variable capacitance which is variable in dependence upon a fine-tuning control signal and is constituted by capacitance occurring in the collector circuit of a transistor, and is variable in dependence upon a fine-tuning control signal applied to an electrode pair of the transistor. A tunable oscillator of this type is known from U.S. Pat. No. 4,034,298 in which the oscillator transistor itself constitutes the variable capacitance in that the capacitance of its base-collector diode is varied by means of a fine-tuning control signal which is applied to the collector of the transistor. In accordance with the working point required for oscillator operation of the transistor, its base-collector diode is always cut off so that only relatively small capacitance variations can be achieved.

It is an object of the invention to improve the turnablility of an oscillator of the type described in the opening paragraph in such a way that a large and stable variation range of the capacitance reqruied for fine tuning is achieved, also at relatively low values of the supply voltage for the circuit arrangement.

SUMMARY OF THE INVENTION

According to the invention, the oscillator is comprised of an active circuit element and parallel resonant circuit. A separate transistor whose collector is capacitively coupled to the parallel resonant circuit and whose base and emitter are connected to ground for alternating current, the working point or operating point of the transistor is chosen to be such that both is base-emitter diode or junction and its base-collector diode are forward biased, and the fine-tuning control signal is applied to the base-emitter path of the transistor, the fine-tuning control signal within its control range driving the base-collector diode further into conduction on the one hand and into its cut-off region on the other hand.

With such a choice, according to the invention, of the working point of the transistor, at which point this transistor is in its saturation range with both its base-emitter diode and its base-collector diode being forward biased, a relatively large variation range of the varying capacitance of the base-collector diode is obtained. It turned out to be completely surprising that at such a working point the transistor could be satisfactorily operated as a variable capacitance, because particularly in this range the capacitance variation of the base-collector diode is known to have a strong non-linear character. The fact that such an operation is nevertheless possible is based on the recognition that within the control range of the fine-tuning control signal on the one hand the base-collector diode is further driven into conduction, which, as is known, results in relatively large capacitance variations, and on the other hand it is also driven into its cut-off region at which the dc gain of the transistor becomes active and thus ensures relatively large variations of the voltage at the base-collector diode, which variations in their turn result in relatively large capacitance variations. In this way relatively large symmetrical capacitance variations for fine-tuning the oscillator are obtained within the control range of the fine-tuning control signal. Moreover, the circuit arrangement can also be operated at relatively low values for its supply voltage, which does not require stabilization, as is otherwise often necessary, because supply voltage variations are substantially not converted into disturbing capacitance variations of the base-collector diode and because the working point of the transistor is chosen to be in its saturation range in which, as is known, supply voltage variations substantially do not have any effect on its collector voltage and thus neither on the voltage at its base-collector diode and, when it is driven out of its saturation range, the capacitance variations of its base-collector diode, which is then operated in its cut-off region, will rapidly become smaller as the voltage at this diode increases, so that also in this case any influence in this respect is no longer essentially significant. Moreover, such a circuit is also very suitable as an integrated circuit because only a relatively small crystal surface area for the transistor is required for relatively large capacitance variations.

Furthermore it has been proved to be advantageous if the fine-tuning control signal is applied to the base-emitter path of the transistor via an RC member, enabling therewith the fine-tuning control signal within its control range to drive the base-collector diode on the one hand so far into conduction until the voltage occurring at the base-emitter path and being present at the base-collector diode is limited essentially to a maximum attainable value determined by the resistance of the RC memeber in cooperation with the impedance of the base-emitter path of the transistor, and on the other hand so far into its cut-off region until its capacitance is essentially not varied anymore. Due to such a limitation of the voltage at the base-collector diode, when the base-collector diode is further driven into conduction, no essential capacitance variation occurs, as is also the case when the base-collector diode is further driven into its cut-off region. In this way satisfactory symmetrical properties for fine tuning the oscillator are obtained at relatively large capacitance variations, while the two-sided limitation of the capacitance variation also results in a faultless two-sided limitation of the hold range of the oscillator, which is essential for its satisfactory tunability.

An embodiment of the invention will hereinafter be described by way of non-limitative example with reference to the drawing.

DETAILED DESCRIPTION OF THE INVENTION

Figure 1:
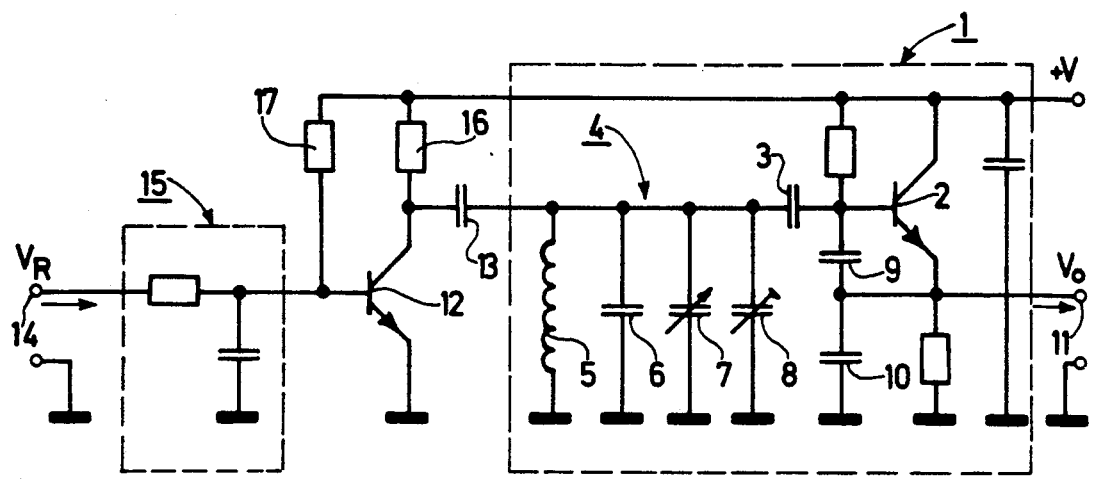
FIG. 1 shows the circuit diagram of an oscillator which is suitable for controlling a mixer stage in a tuner and which has a variable capacitance to enable its fine tuning, which capacitance is variable in dependence upon a fine-tuning control signal.

FIG. 1 shows the circuit diagram of an oscillator 1 comprising an active element or oscillator transistor 2 which is coupled via a capacitor 3 to a parallel resonant circuit 4 consisting of an inductance 5, a capacitor 6, a tuning capacitor 7 and a trimming capacitor 8. The oscillator transistor 2 is arranged in common collector configuration in which the feedback is realized by a capacitive voltage divider comprising two capacitors 9 and 10 and being operative between the base of the oscillator transistor 2 and its emitter. The oscillator signal is derived from the emitter of the oscillator transistor 2 and is available at the output 11 of the oscillator from which it can be applied to a mixer stage in a tuner both of which are not further shown. The relevant oscillator circuit may of course also be formed differently within the scope of the state of the art, for example, with regard to the choice of the type and method of feedback. This also applies to the choice of the tuning capacitor 7 which may be either a variable capacitor or a capacitance diode. Such oscillators are conventionally adapted to be fine-tuned by means of a fine-tuning control signal which is gained from the useful signal processed with the tuner and subsequent signal processing stages, so as to be able to compensate for mistuning, being effected by means of so-called AFC circuits. Requirements are imposed on such AFC circuits in different respects, namely: they should not cause any frequency drift in case of supply voltage variations; they should have a symmetrical operation, in which the capacitance variation on either side of a working point varies substantially linearly with the control signal; they should provide a predetermined capture and hold range for the oscillator, in which the hold range should not be too large to aggravate the tuning, and so forth. Conventionally, such AFC circuits use a controllable impedance incorporated in the parallel resonant circuit of the oscillator and formed by the junction capacitance of a semiconductor section, for example, of a semiconductor diode or a transistor, in the latter case, for example the capacitance occurring in the collector circuit of a transistor so as to achieve fine tuning of the oscillator.

Figure 2:
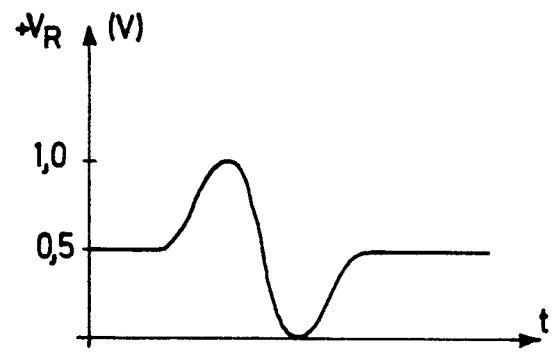
FIG. 2 shows a diagram to explain the variation of the fine-tuning control signal which controls the variable capacitance.

In order to satisfy the above-described requirements in a simple manner, the variable capacitance incorporated in the parallel resonant circuit is realized in accordance with the present embodiment by a separate transistor 12 whose collector is capacitively coupled to the parallel resonant circuit 4 by means of a capacitor 13 and which is arranged in common base configuration for alternating current, while its base-collector diode or junction constitutes the variable capacitance. The fine-tuning control signal, which is usually gained by means of a detector circuit (not shown) and which is a measure of the required fine tuning, is applied from an input 14 to the base-emitter path of the transistor 12, while in the relevant case an RC member or RC circuit 15, whose operation will hereinafter be described, is arranged between the input 14 and the base of the transistor 12. For the envisaged operation it is essential that the working point or operating point of the transistor 12, which in relation to the supply voltage is known to be determined by its collector resistor 16, its base-series resistor 17 and by the base-coupled output impedance of the source supplying fine-tuning control signal, is chosen to be in its saturation range in which both its base-emitter diode and its base-collector diode are forward biased at which within its control range the fine-tuning control signal applied from the input 14 to the base of the transistor 12 is able to drive the base-collector diode of the transistor 12 further into conduction on the one hand and is able to drive it into its cut-off region on the other hand. Such a drive is effected under the influence of the fine-tuning control signal $V_R$ shown in FIG. 2, at which the transistor 12 is driven further into its saturation range by its collector current which increases at the voltage, starting from a quiescent value, increases and at which it is driven out of its saturation range by its collector current which decreases as the voltage decreases with respect to the quiescent value. However, this means that in the first-mentioned case the capacitance constituted by the variable capacitance of the base-collector diode of the transistor 12 increases to a relatively strong degree because this transistor is further driven into conduction, thus resulting in a relatively large capacitance variation, whereas in the second case the base-collector diode is driven into its cut-off region at which the dc gain of the transistor becomes active and thus ensures relatively large variations of the voltage at the base-collector diode, which variations in their turn result in a relatively large capacitance variation.

Figure 3:
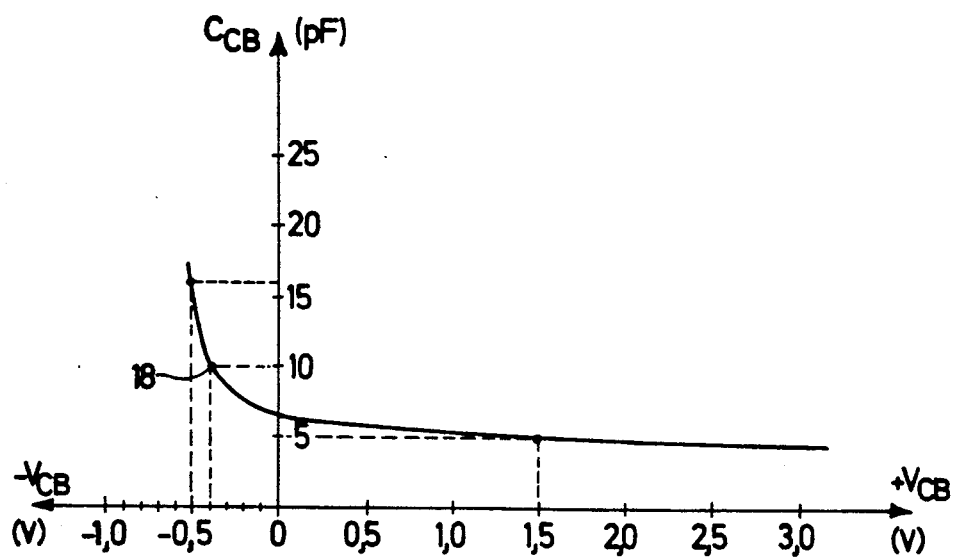
FIG. 3 shows a diagram of the variation of the capacitance occurring in the collector circuit of a transistor, which capacitance is variable in dependence upon the fine-tuning control signal shown in FIG. 2.

Such a variaiton of the capacitance of the base-collector diode of transistor 12 is in FIG. 3, namely for a transistor which is commercially available at type BC 548. In FIG. 3 the capacitance of the base-collector diode denoted by $C_{CB}$ is shown on the ordinate and the voltage $V_{CB}$ at the base-collector diode is shown on the abscissa, while the working point of the transistor is denoted by 18. In the range of the negative voltage $V_{CB}$ the base-collector diode is in its pass or conducting region, whereas it is in its cut-off region in the range of the positive voltage $V_{CB}$. As is shown in this diagram of FIG. 3, relatively large capacitance variations are produced at already small variations of the voltage at the base-collector diode in its pass region, whereas the capacitance variations in a base-collector diode in its cut-off region become increasingly smaller as the voltage at this diode is larger, which, however, does not affect the symmetry of the fine tuning of the oscillator carried out by means of these capacitance variations, because, as already stated, the dc gain of the transistor becomes active in this region and thus ensures relatively large variations of the voltage at the base-collector diode, which variations in their turn result in relatively large capacitance variations. As a result of the relatively large possible capacitance variation the circuit arrangement may therefore also be operated at a relatively low supply voltage because large voltage swings are not required. Supply voltage variations do not have any essential influence on the capacitance variation of the base-collector diode, because the transistor itself is in its saturation range when the base-collector diode is in its pass region, and, as is known, supply voltage variations in this saturation range do not have substantially any effect on its collector voltage and thus not on the voltage at its base-collector diode, whereas the capacitance variations in a base-collector diode in its cut-off region become increasingly smaller as the voltage at this diode increases so that also in this case supply voltage variations are essentially ineffective.

As is evident from the foregoing, a limitation of the capacitance variations is automatically achieved when the base-collector diode is driven into its cut-off region, because these variations become increasingly smaller as the cut-off voltage at this diode increases. Thus, in the case of a base-collector diode in its cut-off region, the hold range of the oscillator is also automatically limited as a result of the decreasing capacitance variations when the oscillator is fine-tuned in this direction. If, as in the present embodiment, the above-mentioned RC member or RC circuit 15 is provided, the hold range of the oscillator is also limited in its fine tuning direction at larger capacitance values. This is based on the fact that the resistance of the RC memeber 15, in cooperation with the impedance of the base-emitter path of the transistor 12, limits the voltage occurring at the base-emitter path essentially to a maximum attainable value, so that also the voltage at the base-collector diode does not change anymore and thus does not result in any further capacitance variations of the base-collector diode which is then in its pass region. As is shown in FIG. 3, such a limitation of the capacitance variation occurs in the relevant case at approximately 0.5 V of the voltage at the base-collector diode in the forward direction. When the base-collector diode is in its cut-off region, such a limitation of the capacitance variation, as described above, occurs at approximately 1.5 V of the voltage at this diode. In this way a faultless two-sided limitation of the hold range of the oscillator is achieved, which is essential for its satisfactory tunability.

In summary, an oscillator having very good fine turning properties is obtained in the manner described. As a result of the attainable relatively large capacitance variation such a circuit is also eminently suitable as an integrated circuit, because only a relatively small crystal surface area is required for the transistor 12. A series of modifications of the embodiment described hereinbefore is of course feasible without passing beyond the scope of the invention, in which connection particularly the manner of constructing the oscillator can be mentioned.

I claim:

1. An oscillator, for controlling a mixer stage in a tuner which oscillator comprises:

an active circuit element and a parallel resonant circuit including a variable capacitance which is variable in dependence upon a fine-tuning control signal, characterized in that;

the variable capacitance is comprised of a transistor separate from the active element whose collector is capacitively coupled to the parallel resonant circuit and whose base and emitter are connected to ground for alternating current, in that the operating point of the transistor is chosen to be such that both its base-emitter junction and its base-collector junction are forward biased, and in that the fine-tuning control signal is applied to the base-emitter path of the transistor, said fine-tuning control signal within its control range driving the base-collector junction further into conduction on the one hand and into its cut-off region on the other hand.

2. An oscillator as claimed in claim 1, further comprising:

an RC circuit, and characterized in that the fine-tuning control signal is applied to the base-emitter path of the transistor through the RC circuit, with which fine-tuning control signal within its control range the base-collector junction can on the one hand be driven so far into conduction until the voltage occurring at the base-emitter path and being present at the base-collector junction is limited essentially to a maximum attainable value by the resistance of the RC circuit in cooperation with the base-emitter path impedance of the transistor, and can on the other hand be driven so far into its cut-off region until its capacitance is essentially not varied anymore.

* * * * *